United States Patent [19]

Nakanishi et al.

[11] Patent Number: 5,182,527
[45] Date of Patent: Jan. 26, 1993

[54] POWER AMPLIFYING APPARATUS FOR WIRELESS TRANSMITTER

[75] Inventors: Eiichi Nakanishi; Tetsuo Onodera, both of Tokyo, Japan

[73] Assignee: Oki Electric Industry Co., Ltd., Tokyo, Japan

[21] Appl. No.: 744,393

[22] Filed: Aug. 13, 1991

Related U.S. Application Data

[62] Division of Ser. No. 672,414, Mar. 20, 1991, Pat. No. 5,126,688.

[30] Foreign Application Priority Data

| Mar. 30, 1990 [JP] | Japan | 2-80925 |
| Apr. 20, 1990 [JP] | Japan | 2-104775 |
| Apr. 20, 1990 [JP] | Japan | 2-104776 |
| Aug. 10, 1990 [JP] | Japan | 2-213429 |
| Sep. 21, 1990 [JP] | Japan | 2-250065 |

[51] Int. Cl.$^5$ .................................... H03G 3/30
[52] U.S. Cl. ........................... 330/285; 330/279; 330/129; 455/126; 455/127
[58] Field of Search ............... 330/285, 127, 128, 129, 330/138, 280; 455/116, 126, 127

[56] References Cited

U.S. PATENT DOCUMENTS

| 3,486,128 | 12/1969 | Lohrmann | 330/285 |
| 4,570,127 | 2/1986 | Tanimoto et al. | 330/279 |
| 5,029,298 | 7/1991 | Chiba et al. | 330/285 |
| 5,038,112 | 8/1991 | O'Neill | 330/298 |
| 5,043,672 | 8/1991 | Youn | 330/129 |

FOREIGN PATENT DOCUMENTS 1119110 5/1989 Japan ........................ 330/285

Primary Examiner—Paul M. Dzierzynski
Assistant Examiner—Tan Dinh
Attorney, Agent, or Firm—Spencer, Frank & Schneider

[57] ABSTRACT

A power amplifying apparatus according to the present invention can provide a stable electric power output with wide range by controlling both of the output amplifier for amplifying the electric power and the pre-amplifier disposed at the front of the output amplifier. Furthermore, in order to avoid the disadvantage that a transmission spectrum is expanded because of no supply of a stable voltage to be supplied to the electric power amplifier, thereby producing a cross-talk, a stabilizing power source circuit is provided to stabilize the voltage between the power amplifier and the power source for supplying the voltage.

2 Claims, 11 Drawing Sheets

POWER AMPLIFYING APPARATUS FOR WIRELESS TRANSMITTER

This is a division of application Ser. No. 07/672,414 filed Mar. 20, 1991 and now U.S. Pat. No. 5,126,688.

REFERENCE TO RELATED APPLICATION

This application claims the right of priority under 35 U.S.C. 119, of Japanese Patent Application Serial No. 02-080925, filed on Mar. 30; 02-104775 and 02-104776 filed on Apr. 20; 02-213429, filed on Aug. 10; and 02-250065 filed on Sep. 21, 1990, the entire disclosure of which is incorporated herein by reference.

BACKGROUND OF THE INVENTION

Field of the Invention

The present invention relates to a power amplifying apparatus, and particularly to a power amplifying apparatus effectively applicable to a wireless transmitter such as a mobile communication system.

Description of the Related Art

As a communication system, there is, for example, a telephone system for automobiles. The automobile telephone system is composed of an exchanging station to be connected to a public telephone network through a local station as a superior station, a base station for setting a mobile wireless line between mobile stations as an automobile telephone station on the indication of the exchanger, and mobile stations as the automobile telephone including a controlling circuit driven by the indication from the exchanger. It is necessary for the communication system to control an output level of an electric power in the transmitter within the automobile telephone, in accordance with the distance between the base station and the automobile telephone. Therefore, the transmitter has a power amplifying apparatus in which the output electric power level can be switched, for example, 6 to 8 stages, thereby providing a suitable transmission electric power between the base station and the automobile telephone.

There is a prior art power amplifying apparatus in which an output electric power level is changed, such as "Bidirectional Field Type Voltage Controlled Amplifier (BDF-DVCA)" by Chiba et al, Singaku Review, Vol. 89, No. 250, Pages 7 to 12. The prior art power amplifying apparatus is constructed in such a way that the power amplifier composed of a plurality of amplifiers for amplifying transmission electric power, is controlled in a feedback system in accordance with the distance from the base station. In general, a conventional automobile power amplifier in a cellular system uses a C-class amplifier as an output amplifier in point of an efficiency of an electric power. In the case where such C-class amplifier is used as a linear amplifier in an analog cellular system, it is important to use an amplifier element in a saturation state in view of the electric power efficiency. Therefore, the C-class amplifier has been used for a feedback control for amplifying the electric power thereby increasing the efficiency of an electric power source.

However, according to the conventional technique for effecting the electric power control by using C-class amplifier as an output amplifier, if a feedback voltage of the C-class amplifier is much reduced in order to reduce the transmission power outputted from the power amplifier, the collector-base junction in the transistor composed of the C-class amplifier is reversed in comparison with a normal bias condition, thereby increasing a feedback capacitance and providing an unstable condition. Therefore, it is necessary to apply a feedback voltage within the range in which the C-class amplifier does not oscillated to make the unstable condition and further the power control at the low level side of the output power is limited thereby resulting in a narrow range of the power control. This is similar to the case that an FET transistor is used as the C-class amplifier. Moreover, according to the prior art there is the problem that the phase delay of a pulse eliminating filter is large and a loop oscillation is apt to be generated. Furthermore, in the prior art the collector voltage is changed, and therefore the feedback capacitance between the collector and the base thereof is changed thereby generating a conversion distortion in which the output phase is changed by an amplitude, in the conversion of an amplitude modulation (AM) to a phase modulation (PM). Moreover, it is difficult to control the output electric power over 50 dB or more.

Moreover, there is a prior art in which a constant voltage is applied to an output amplifier, and an AB-class amplifier is disposed at the front stage of the output amplifier used for a control, and a feedback control is effected with respect to the control amplifier. However, according to the power amplifying apparatus thus constructed, there are the following problems with respect to a linearity of an electric power control. FIG. 12 shows an output power characteristic in the prior art when the feedback voltage to be applied to the power source terminals of the power amplifier is changed. In the figure, the abscissa is a feedback voltage in a linear scale and the ordinate is an output power PO in the logarithm scale. In the figure, the solid line P1 shows a practical control characteristic curve and the dotted line P2 shows an ideal linear curve. As is apparent from the figure, the output power characteristic can be divided into three areas of a non-linear area A, a linear area B and a saturation area C. The non-linear area A is one due to a limit of the isolation characteristic of each of the amplifying elements composing the power amplifier. Namely, even if for example the input power is made a minimum value or zero in view of the characteristic of the amplifier element, a leakage of signals to the output side is generated because of an isolation characteristic thereby not making the output power zero. The linear area B is one in which the output power is changed with a linearity with respect to the feedback voltage applied to the control amplifier. The saturation area C is one resulted from the ability limit of the amplifier element. For example, according to an automobile telephone in a digital cellular mobile communication system, it is important that the output power of the power amplifier is linearly changed with respect to the feedback voltage and further an electric power can be controlled over wide range of 50 dB. However, there are problems for the conventional power amplifying apparatus that the non-linearity in the non-linear area A upon small output and that the control range of the electric power is narrow because of a large maximum controllable electric power due to the limit caused by the isolation characteristic.

Furthermore, in a transmitter of the digital cellular mobile telephone applied with the conventional technique, there is used an amplitude-phase modulation system such as π/4 shift DQPSK (differential quadrature phase shift keying). In this case, since information is contained in not only a phase component but also an amplitude component, it is necessary to correctly amplify in fidelity also the amplitude component in a linear electric power amplifying apparatus. However, since the internal impedance of the power source for supplying an electric power to the amplifiers within the electric power amplifying apparatus and the impedance of the power source line are actually not zero, the voltage deviation corresponding to the output power envelope from the power amplifier is generated also at the power source terminal for supplying the electric power to the power amplifier. Upon generation of such deviation, the output signal is modulated by the deviation thereby undesirably expanding a transmission spectrum. FIGS. 13a and 13b show a deterioration due to the deviation of the source voltage, and FIG. 13a is a signal space view of $\pi/4$ DQPSK, and FIG. 13b shows the expansion of spectrum with the abscissa of frequency F and the ordinate of an electric power level. When the conversion distortion in the conversion of the amplitude modulation to the phase modulation in the power amplifier is generated due to the generation of the deviation of the source voltage, the deviation of signal points S as shown in FIG. 13a is produced. As a result, the edge portions at both sides of the transmission channel (e.g. 30 KHz) is shifted upwardly as shown by the arrow in FIG. 13b, and the spectrum is expanded, thereby causing a radio interference with respect to the adjacent channels. To avoid such deviation of the source voltage, it is considered to provide a bypass capacitor with large capacitance for the electric power source.

However, in the mobile telephone of the digital system, since a time divisional multiplex access system (TDMA system) is normally used for the purpose of increasing the utilization efficiency of channel, a burst control is effected. Therefore, the power amplifier also performs an ON-OFF control of the power source voltage to effect the burst control. FIG. 14 shows an example of the burst power control for the North America System. According to this burst power control, the output power PO is set ON-state during e.g. 6.66 ms and then OFF-state during e.g. 6.66×2 ms in order to effect a communication of one telephone. Since the TDMA system is utilized with high precision in the burst power control, it is necessary that a predetermined electric power level is achieved within a predetermined ramp-up time ta at the raising position of the output power PO. However, if the bypass capacitor with large capacitance is used to avoid the deviation of the power voltage, the response time necessary for the ON and OFF operation of the power voltage is increased, and therefore the ramp up time ta of the output power PO exceeds a predetermined time. Since the time divisional multiplex access system is used for the digital mobile telephone, it is substantially impossible to avoid the expansion of the spectrum by increasing the capacitance of the bypass capacitor.

BRIEF SUMMARY OF THE PRESENT INVENTION

It is a general object of the present invention to provide a power amplifying apparatus for a wireless transmitter in which an electric power control is achieved without any oscillation of an amplifier element and with a stable condition and a high power efficiency, even in the case that a feedback control of an electric power with a low control power level is effected in a power amplifier using a plurality of amplifying stages.

It is a more specific object of the present invention to provide a power controlling circuit capable of an electric power control over a wide range.

It is another object of the present invention to provide a power controlling circuit in which a non-linearity of the characteristic between the output electric power and the feedback voltage when a control output power is small is eliminated.

It is still another object of the present invention to provide a linear power amplifying apparatus in which there is solved the problem of contradiction between the transmission spectrum is expanded because of the deviation of a power source voltage to be applied to the power source terminals of a linear power amplifier and the realization of a necessary burst control.

It is a further object of the present invention to provide a linear power amplifier with a stable loop operation ,capable of making small the amount of AM-PM conversion and further making small the consumption of electric power.

A power amplifying apparatus having power amplifying means composed of a plurality of power amplifiers, for controlling the power outputted from the power amplifying means to a predetermined electric power level by using a feedback control, comprising;

power controlling means for outputting a control signal so as to obtain a desired output of the electric power from the power amplifying means, a first controlling means for fetching a monitor voltage from the power amplifying means, converting the monitor voltage into a predetermined level on the basis of the control signal from the power controlling means, and controlling the output by feedbacking the converted monitor voltage into a predetermined power amplifier of the power amplifying means, and a second controlling means for receiving the control signal from the power controlling means and conducting the control according to the received control signal with respect to a predetermined electric power amplifier of the power amplifying means.

A power amplifying apparatus having a power amplifying means for amplifying the amplitude component of an input electric power on the basis of the voltage applied to the terminal of a power source, comprising voltage stabilizing means disposed between the power source terminal of the power amplifying means and the terminal of a battery source, for supplying the stabilized voltage to the power source terminal of the power amplifying means by controlling in feedback operation the output voltage of a battery connected to the terminal of the battery.

Further scope of applicability of the present invention will become apparent from the detailed description and specific examples, while indication preferred embodiments of the present invention, are given by way of illustration only, since various changes and modifications within the spirit and scope of the invention will become apparent to those skilled in the art from this detailed description.

BRIEF DESCRIPTION OF SEVERAL VIEW OF DRAWINGS

These and other features and advantages of the present invention may be more completely understood from the following detailed description of the preferred embodiments of the present invention with reference to the accompanying drawings in which;

FIG. 1 illustrates a block diagram showing an embodiment of a power amplifying apparatus for a wireless transmitter of the present invention, FIG. 2 is a circuit diagram showing an example of the output stage amplifier in FIG. 1, FIG. 3 is a block diagram showing other embodiment of the present invention, FIG. 4 shows a characteristic between a feedback voltage and an output electric power in the embodiment shown in FIG. 2, FIG. 5 is a block diagram showing a main portion of still other embodiment of the present invention, FIG. 6 is a block diagram showing of other embodiment of the present invention, FIG. 7 is a block diagram showing still other embodiment of the present invention, FIG. 8 is a block diagram showing other embodiment of the present invention, FIG. 9 is a view for explaining the operation of PWM in FIG. 8, FIG. 10 shows a circuit showing one example of LPE in FIG. 8, FIG. 11 is a view for explaining the output waveform of the power amplifying apparatus in FIG. 8, FIG. 12 shows a characteristic between a feedback voltage and an output electric power in the prior art, FIG. 13a is a view showing the signal space of $\pi/4$ DQPSK in prior art, FIG. 13b is a view for explaining the expansion of the spectrum in the prior art, and FIG. 14 is a view for explaining the burst control in the prior art.

DETAILED DESCRIPTION OF THE PREFERRED EMBODIMENTS

Figure 1:
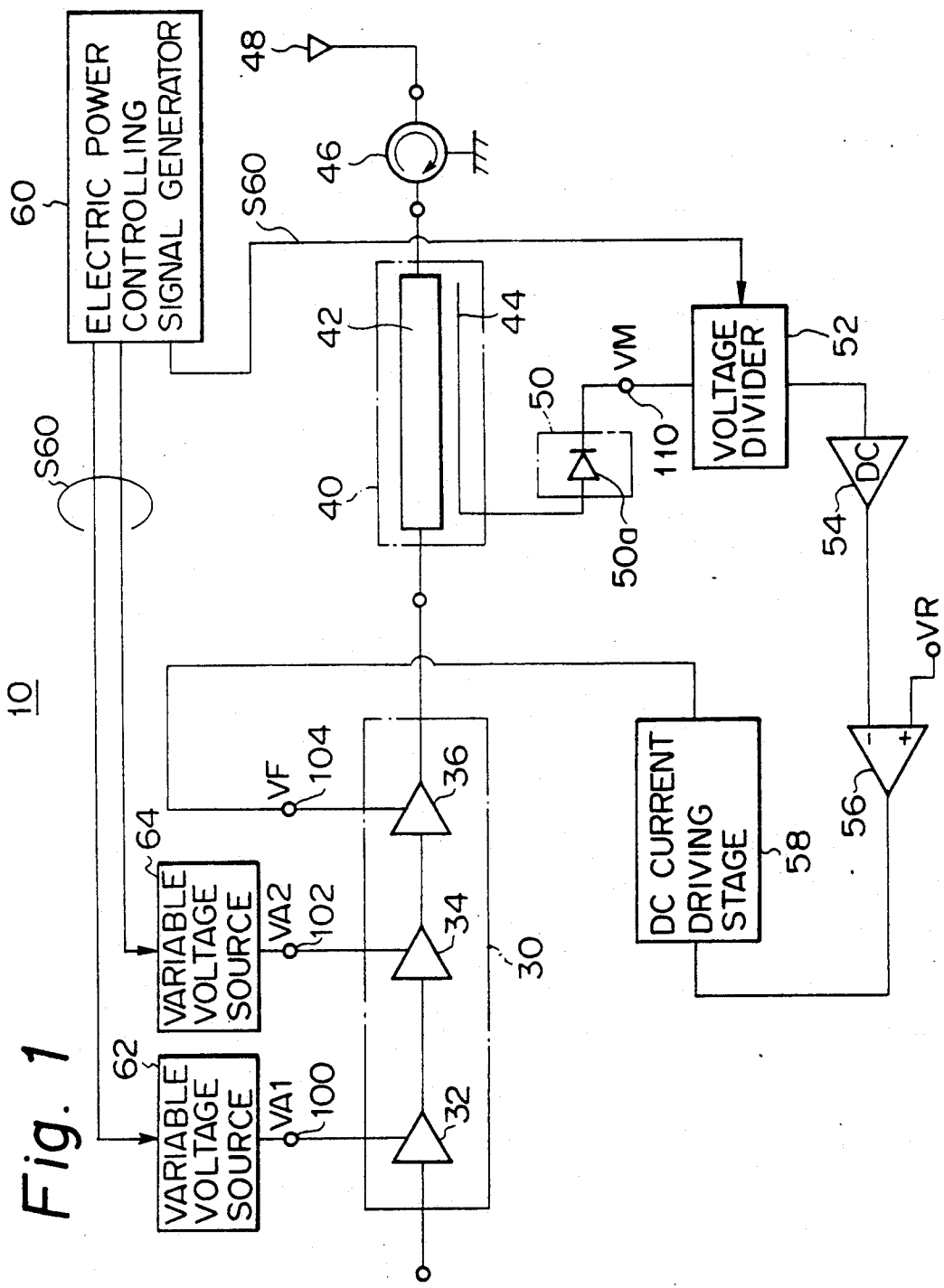

FIG. 1 is a block diagram showing an embodiment of the present invention in which there is shown a power amplifying apparatus 10 to be installed within a wireless transmitter of an automobile telephone for a cellular mobile communication preferably in a digital cellular system.

The power amplifying apparatus 10 includes an electric power control portion and a power amplifier 30 the output of which is controlled in a feedback. The power amplifier 30 is composed of two pre-stage amplifiers 32 and 34 for amplifying an input electric power and an output stage amplifier 36. The pre-stage amplifier 32 is used as a driver for amplifying the input electric power, and a variable source voltage, VA1 is applied to a power source terminal 100. The pre-stage amplifier 34 is a circuit for amplifying the output voltage of the amplifier 32 and is composed of a large power amplifier such as an AB-class amplifier, and a variable power source voltage VA2 is applied to a power source terminal 102. The output stage amplifier 36 is a circuit for amplifying the output electric power of the amplifier 34 and is composed of C-class amplifier having a large electric power efficiency, and a feedback voltage VF is applied to a power source terminal 104.

Each of the amplifiers 32, 34 and 36 is composed of one stage or a plurality of stages.

Figure 2:
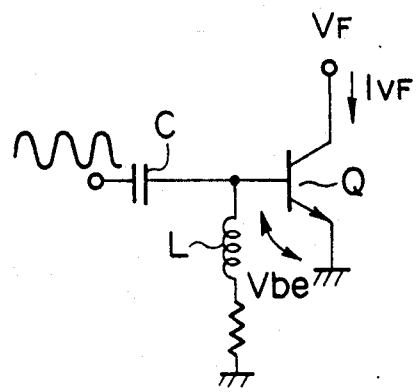

The C-class amplifier 36 has, as shown in FIG. 2, a transistor Q of the NPN type and the collector of which is connected to a power voltage VF and the emitter of which is connected to the ground. The base of the transistor Q is connected to an input capacitor C and the ground through a reactance L.

In such C-class amplifier, since the bias voltage for the base of the transistor Q is zero, the collector current IVF flows when the amplitude of A. C. voltage applied to the base of the transistor Q exceeds the voltage Vbe (ON voltage) between the base and the emitter of the transistor Q, thereby effecting the operation of C-class amplification.

The output terminal of the power amplifier 30 is connected to a high frequency power fetching device 40. The high frequency power fetching device 40 is composed of an output transmission line 42 and a coupling transmission line 44 made of, for example, a strip line. The output transmission line 42 is connected to an antenna 48 through an isolator 46 which is a non-reversible passive element. The isolator 46 is connected to a receiving circuit (not shown).

The coupling transmission line 44 is used for fetching a portion of the output electric power from the power amplifier 30, and the output side thereof is connected to a detection circuit 50 composed of a detection diode 50a etc. The detection circuit 50 is used for monitoring or detecting the input electric power level of a high frequency signal e.g. several hundred MHZ from the coupling transmission line 44 as a signal source for effecting the monitor, and for outputting an output monitor voltage VM at a monitor voltage outputting point 110.

The monitor voltage outputting point 110 is connected to a voltage divider 52 capable of being switched with plural division ratio by a control signal S60. At the output terminal of the voltage divider 52, the negative (−) input terminal of the comparator 56 is connected through a D. C. amplifier stage 54 composed of D. C. amplifier. The comparator 56 is a circuit for comparing the output voltage of the D. C. amplifier 54 with the reference voltage VR applied to the positive (+) input terminal. At the output terminal of the comparator 56, the power source terminal 104 of the output stage amplifier 36 is connected through the current driving stage 58 composed of a current drive amplifier for outputting the feedback voltage VF. By the above-mentioned system, a feedback circuit for controlling an electric power.

The power controlling circuit 10 includes a power controlling signal generator 60, the output side of which is connected to the voltage divider 52 and further to the terminals 100 and 102 of the pre-stage side amplifiers 32 and 34 through variable voltage sources 62 and 64, respectively.

The power controlling signal generator 60 is composed of a central processing unit CPU to detect the distance from a basis station on the base of a received radio level from the base station (not shown), and to control the voltage divider 52 and the variable voltage source 62 and 64 by using the control signal S60 so as to change the output power level of the power amplifier 30. The variable voltage sources 62 and 64 are circuits for supplying the variable source voltages VA1 and VA2 according to the control signal S60 to the terminals 100 and 102 of the pre-stage side amplifiers 32 and 34 respectively, and function as gain changing means for changing the gain of the amplifiers 32 and 34.

In operation, when the transmission electric power is inputted to the power amplifier 30, the inputted electric power is amplified by the pre-stage side amplifiers 32 and 34 on the basis of the gain controlled by the respective variable source voltage VA1 and VA2. Then, the inputted electric power is amplified through the output stage amplifier 36 on the basis of the gain controlled by the feedback voltage VF. The output electric power of the output stage amplifier 36 is supplied to the antenna 48 through the output transmission line 42 and the isolator 46 within the high frequency power fetching means 40, and transmitted into the air. The transmitted radio wave is received at the base station (not shown). The radio wave from the base station is received by the antenna 48 and inputted into the receiver side (not shown).

In the power controlling signal generator 60, the distance from the base station is detected on the basis of the signal level received at the base station side, and the control signal S60 according to the distance is supplied to the voltage divider 52 and the variable voltage sources 62 and 64.

A portion of the output electric power from the output stage amplifier 36 in the power amplifier 30 is fetched by the coupling transmission line 44 and detected by the detector 50, and then the output monitor voltage VM is outputted from the monitor voltage outputting point 110. The output monitor voltage VM is divided into the voltage according to the electric power control level by the voltage divider 52 which is controlled by the control signal S60.

The voltage divided by the voltage divider 52 is amplified by the D. C. amplifier stage 54 and then compared with the reference voltage VR by the comparator 56. The output voltage from the comparator 56 is increased in electric current driving ability by the electric current driver 58 and then applied to the power source terminal 104 of the output stage amplifier 36 in the power amplifier 30. Then, the output stage amplifier 36 amplifies the output electric power from the pre-stage side amplifier 32 on the basis of the gain according to the feedback voltage VF. The variable voltage sources 62 and 64 applies the variable source voltages VA1 and VA2 respectively according to the control electric power level to the pre-stage side amplifiers 32 and 34 on the basis of the control signal S60 from the electric power controlling signal generator 60. Therefore, the pre-stage side amplifiers 32 and 34 amplify the inputted electric power on the gain changed by the variable source voltages VA1 and VA2 applied to the source terminals 100 and 102. The output electric power amplified by the pre-stage side amplifier 34 is amplified by the output stage amplifier 36 and then transmitted through the air by way of the output transmission line 42, the isolator 46 and the antenna 48.

The features of the present embodiment are not only to control the output power level of the output stage amplifier 36 by means of the feedback voltage VF but also to change the output power level of the pre-stage side amplifiers 32 and 34 by means of the gain varying portion. These will be further explained hereinafter.

The control signal S60 according to the control power level from the power controlling signal generator 60 is applied to the voltage divider 52 and further to the variable voltage sources 62 and 64. Therefore, the dividing ratio of the voltage divider 52 can be switched and further the output power level of the pre-stage side amplifiers 32 and 34 can be changed by means of the variable source voltages VA1 and VA2 changed by the variable voltage sources 62 and 64.

At this time, if the feedback voltage VF is controlled in a small value, e.g. about 1 volt for controlling the output electric power from the power amplifier 30, the variable source voltages VA1 and VA2 are also made to be small in accordance with the feedback voltage VF. Therefore, the input power level applied to the output stage amplifier 36 is restricted in a small value, and as a result a reversal bias is normally applied to the base-collector junction of the transistor Q (see FIG. 2) composing the output stage amplifier 36. By this, an unstable operation, such as an oscillation, of the output stage amplifier 36 can be prevented thereby outputting an electric power level from the output stage amplifier 36 in a stable state. At this time, the output power level of the pre-stage side amplifiers 32 and 34 become also reduced and therefore the consumable current of the amplifiers 32 and 34 is also reduced thereby increasing an electric power efficiency. Furthermore, the output powers from the pre-stage side amplifiers 32 and 34 are also restricted and therefore the control range for the output electric power is also broadened for the entire power amplifying apparatus.

The present invention should not limited to the embodiment as shown in FIG. 1, but various modifications may be made as follows.

(a) In this embodiment, the power amplifier 30 is composed of two pre-stage side amplifiers 32 and 34 and a single output stage amplifier 36, but it may be possible to add other pre-stage side amplifier or omit the amplifier 32. Furthermore, it may be possible to use B-class amplifier except AB Class amplifier for the amplifier 34, and to use the amplifier except C-class amplifier for the output stage amplifier 36.

(b) In this embodiment, it is provided that the gain varying portion composed of the variable voltage sources 62 and 64 change the gain of the amplifiers 32 and 34 by changing the source voltages to be applied to the pre-stage side amplifiers 32 and 34 respectively. However, it may be possible to change the bias voltages of the amplifiers 32 and 34 thereby changing their gain, and to change the variable voltage sources 62 and 64 to a common circuit.

(c) The feedback circuit for controlling the power amplifier 30 may be changed to another circuit. For example, the high frequency power fetching means 40 in FIG. 1 may fetch a portion of the output power from the power amplifier 30, using another circuit including a coupling capacitor, etc.

As mentioned above, according to the present embodiment in which the output stage amplifier in the power amplifier is controlled in a feedback system by the feedback voltage of the feedback circuit, and further the gain of the pre-stage side amplifiers in the power amplifier is varied by the gain varying portion, if the output electric power becomes small, the output power level of the pre-stage side amplifiers also becomes small. Therefore, the base voltage of the transistor constituting the output stage amplifier is normally below the collector voltage, and therefore the increment of the feedback capacitance of the transistor thereby achieving a stable control of the electric power of the output stage amplifier. Furthermore, when the output power of the power amplifier is controlled in a small condition, the output power of the pre-stage side amplifier is also reduced thereby reducing the consumable current of the amplifier and increasing the electric power efficiency. Furthermore, the output electric power of the pre-stage side amplifier is reduced, and therefore it is achieved to broaden the controllable range of the output electric power. As mentioned above, if the power controlling circuit of the present invention is applied to various devices or circuits, a favorable electric power control is achieved.

Next, other embodiment of the present invention will be explained with reference to FIGS. 3 to 5.

In the figures, similar components or structural elements are designated by the same reference numerals, and redundant description will be avoided for simplicity.

The power amplifying apparatus 12 includes a power amplifier 30a the output electric power of which is controlled in a feedback control. The electric power amplifier 30a is composed of a driver stage 32a for amplifying an input electric power, a control stage 34a composed of an AB-class amplifier for amplifying the output of the drive stage 32a, and an output stage 36a composed of a C-class amplifier for amplifying the output of the control stage 34a. The power source terminal 106 of the control stage 34a is applied with a feedback voltage VFa, and the power source terminal 108 of the output stage 36a is applied with a variable power source voltage VAa.

The output terminal of the power amplifier 30a is connected to a high frequency power fetching device 40. An output transmission line 42a is connected to an antenna through an isolator 41, and the isolator 41 is connected to a receiver side circuit (not shown). A detecting circuit 50 is connected to the output side of a couple transmission line 44.

At a monitor voltage outputting point 110, a voltage divider 52a, in which a dividing ratio is switched by a control signal S61, is connected. The output terminal of the voltage divider 52a is connected to the negative (−) input terminal of a comparator 56a through a D. C. amplifier 54a composed of a direct current amplifier. The comparator 56a is a circuit for comparing the output voltage of the D. C. amplifier 54a with the reference voltage VRa applied to the positive (+) input terminal, and is composed of a reversal amplifier. The output of comparator 56a is connected to the source terminal 106 of a control stage 34a through a current driving stage 58a composed of the current driving amplifier for outputting a feedback voltage VFa. By the system mentioned above, a feedback control circuit used for an electric power control is constituted.

The power amplifying apparatus includes a power controlling signal generator 61 having the output side connected to voltage divider 52a and further to the source terminal 108 of the output stage 36a through a variable voltage source 66.

The power controlling signal generator 61 is a circuit for detecting the distance from the base station on the basis of the received radio level at the base station (not shown) and controlling the voltage divider 52a and the variable voltage source 66 by the control signal S61 in order to change the output power level from the antenna 48 in accordance with the detected distance, and it is composed of a central processing unit, etc. The variable voltage source 66 is a circuit for supplying variable source voltage according to the control signal S61 to the source terminal 108 of the output stage 36a, and functions as a gain varying means for varying the gain of the output stage 36a.

Next, the operation will be explained hereinafter.

When a transmission electric power is inputted to the power amplifier 30a, the inputted electric power is amplified by the driving stage 32a, and further by the control stage 34a on the basis of the gain controlled by the feedback voltage VFa, and then by the output stage 36a on the basis of the gain controlled by the variable source voltage VAa. The output electric power of the output stage 36a is applied to the antenna 48 through the output transmission line 42 in the high frequency power fetching means 40 and the isolator 46. The radio wave emitted into the air is received by the base station (not shown). The radio wave from the base station is received by the antenna 48 and inputted by the receiver side (not shown).

The power controlling signal generator 61 detects the distance from the base station on the basis of the received level at the base station, and the control signal S61 according to the detected distance is applied to the voltage divider 52a and the variable voltage source 66.

A portion of the output electric power of the output stage 36a in the power amplifier 30a is fetched by the coupling transmission line 44 and detected by the detection circuit 50, and then the output monitor voltage VM is outputted from the monitor voltage output point 110. The output monitor voltage VM is divided into the voltages according to the electric power control levels by the voltage divider 52a which is controlled by the control signal S61.

The voltage divided by the voltage divider 52a is amplified by the D. C. amplifier 54a and then compared with the reference voltage VRa by the comparator 56a. The output voltage from the comparator 56a is amplified by the current driving stage 58a and applied to the source terminal 106 of the control stage 34a in the power amplifier 30a. Then, the control stage 34a amplifies the output power of the driving stage 32a by using the gain according to the feedback voltage VF, and the output is applied to the output stage 36a.

The variable voltage source 66 outputs the variable source voltage VAa according to the control power level thereby applying it to the power source terminal 108 of the output stage 36a. Then, the output stage 36a amplifies the output power from the control stage 34a on the basis of the gain changed by the variable source voltage VAa applied at the power source terminal 108. The output electric power of the output stage 36a is emitted into the air through the output transmission line 42, the isolator 46 and the antenna 48.

The feature of the present embodiment is to change the gain of the output stage 36a on the basis of the variable source voltage VAa and the control power level. This will be explained in detail with reference to FIG. 4 hereinafter.

Figure 4:
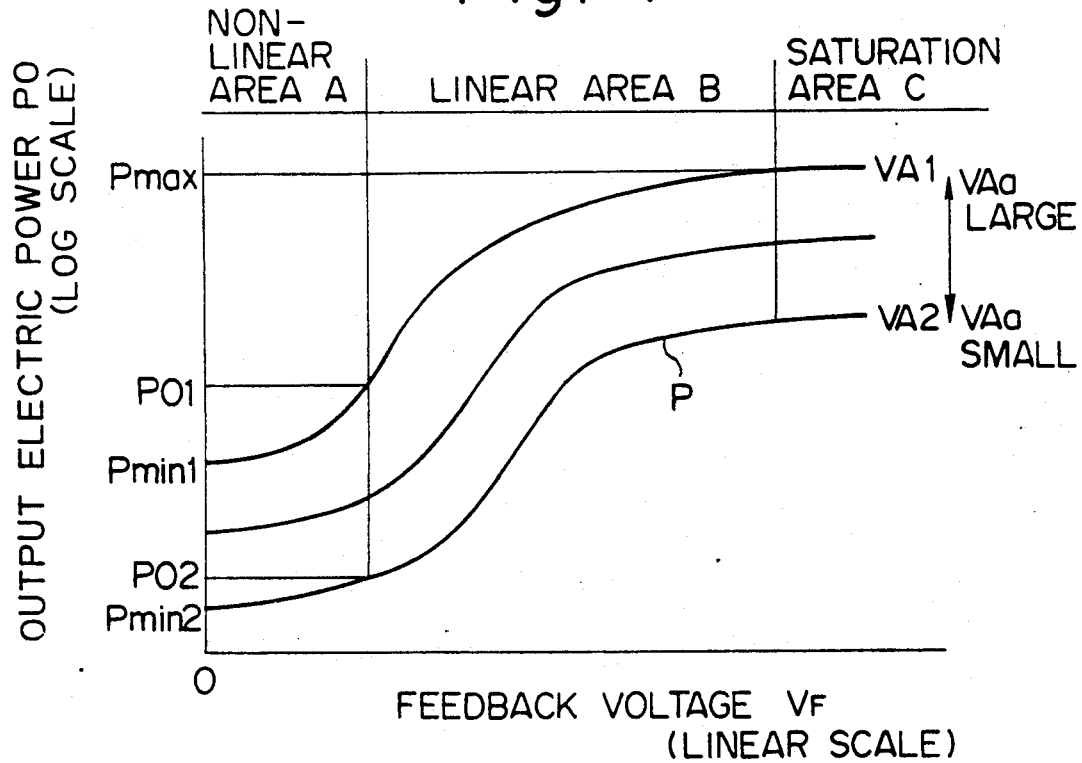

FIG. 4 is a diagram for showing an output electric power characteristic between the feedback voltage and the output voltage when the variable power source voltage in the present embodiment is changed. The abscissa shows the feedback voltage with a linear scale and the ordinate shows the output electric power PO with a logarithm scale. FIG. 4 shows the characteristic of the power amplifier 30a itself without a loop operation shown in FIG. 3.

As shown in FIG. 4, the gain of the final stage amplifier 36a changes as shown by the curve P in accordance with the change of the variable power source voltages VAa to VA1→VA2 (VA1>VA2). When the variable power source voltage VA is equal to the voltage VA1, the linear area B resides in the range from the output electric power P01 to the maximum value Pmax, and on the other hand the linear area B can be expanded until the output electric power P02 when VA=VA2. Therefore, the linear characteristic between the variable source voltage VAa and the output electric power PO can be maintained over a much wider area by switching the variable source voltage VAa in accordance with the output voltage PO.

Furthermore, the minimum controllable electric power in the non-linear area A is also made small from Pmin1 to Pmin2 thereby achieving a wider control of the electric power. Furthermore, since the electric power control is effected on the output stage 36a of the electric power amplifier 30a, the consumable current is reduced to increase the electric power efficiency.

Figure 5:
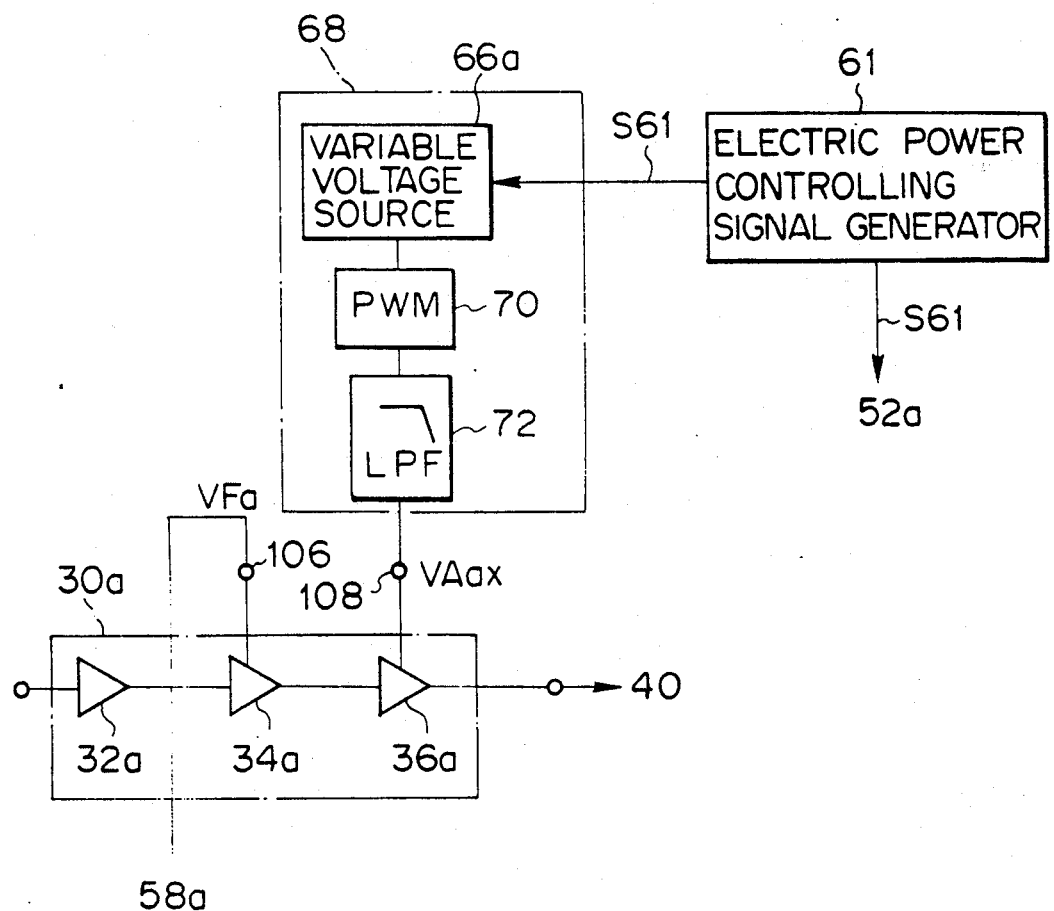

FIG. 5 is a block diagram of a main portion of a power amplifying apparatus 14 according to another embodiment of the present invention.

Figure 3:
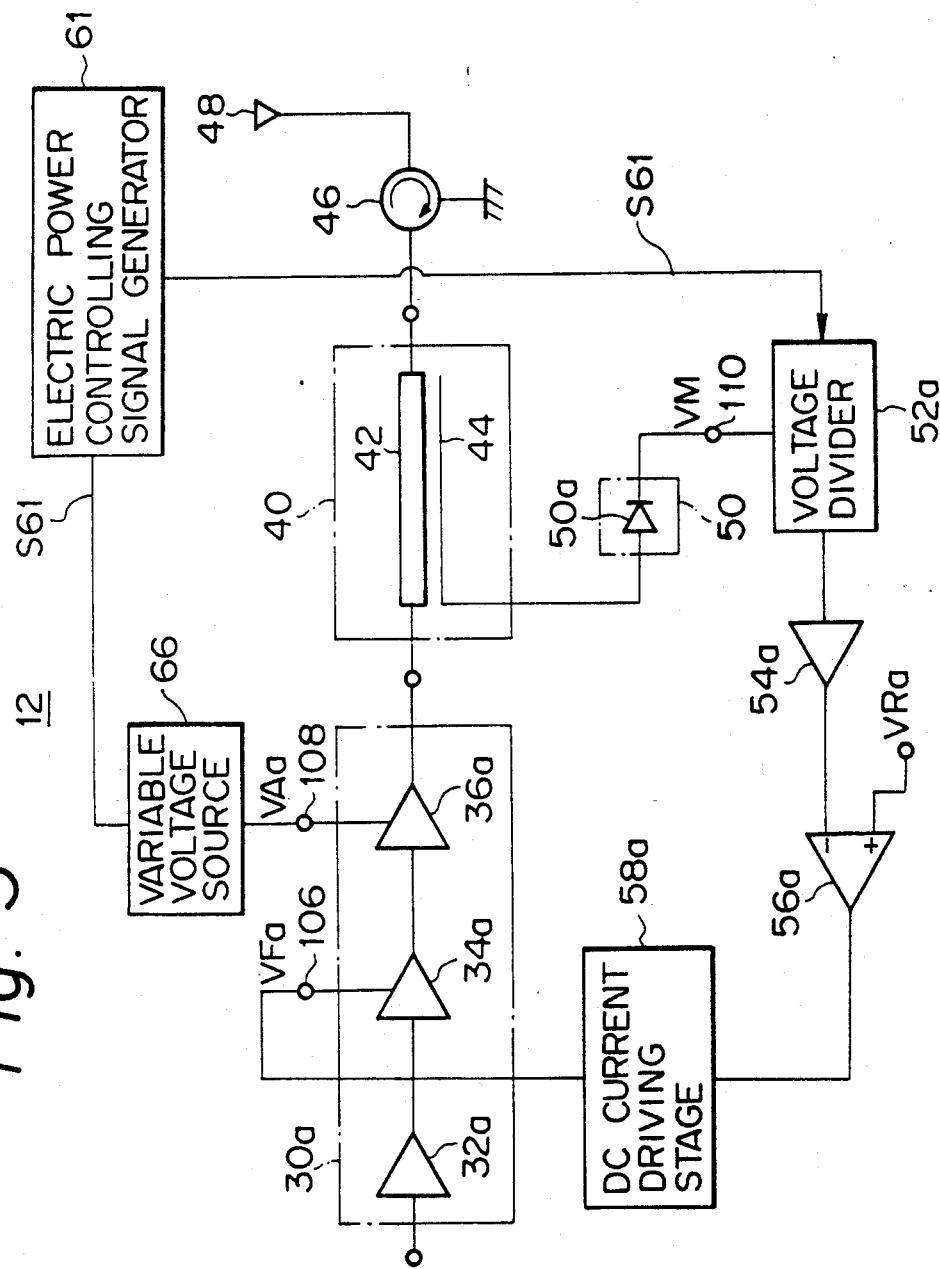

In this embodiment, a variable power source circuit 68 is provided instead of the variable voltage source 66 in FIG. 3. The variable power source circuit 68 is composed of a variable power voltage source 66a for outputting the variable voltage with low power on the basis of the control signal S61, a pulse width modulator 70 (referred simply to as PWM hereinafter) for modulating the output from the variable voltage source 66a in accordance with a pulse width modulation, and a low pass filter 72 (referred simply to as LPF hereinafter) for converting the output from the PWM 70 to a variable D. C. voltage VAax in order to eliminate pulse components.

In this apparatus, when the control signal S61 according to the control power level is applied to the variable voltage source 66a from the power controlling signal generator 61, the variable voltage source 66a outputs the variable voltage according to the control signal S61 to the PWM 70. PWM 70 effects the pulse modulation by switching the output voltage from the variable voltage source 66a, and the modulated output voltage is applied to the LPF 72. The LPF 72 converts the output from the PWM 70 into the D. C. variable source voltage VAax and applies it to the output stage 36a through the power terminal 108. By this process, the output stage 36a outputs the output electric power of the control stage 34a to the output transmission line 42 with the gain according to the variable power source voltage VAax.

According to the present embodiment, since in the final stage 36a of the electric power amplifier 30a, the current e.g. 2 amp. normally flows, the variable power source voltage VAax to be applied to the power source terminal 108 can be varied with a desirable electric power efficiency by the switching operation using the PWM 70. Therefore, it can be achieved to reduce the consumable electric power and increase the electric power efficiency in comparison with the case as shown in FIG. 3. Similar advantages as that in the embodiment of FIG. 3 are provided.

Moreover, the present invention should not limited to the embodiment as shown in the figures but several modification may be possible as follows.

(a) In the above embodiment, the power amplifier 30a is composed of the driving stage 32a, the control stage 34a and the output stage 36a, however it may be possible to omit the driving stage 32a in accordance with an electric power for use, or to use B-class amplifier except the AB-class amplifier for the control stage 34a, and further to construct the output stage 36a by the amplifier except C-class amplifier.

(b) In the above embodiment, the gain varying portion is composed of the variable voltage source 66 or the variable power source circuit 68 and the gain varying portion changes the gain of the output stage 36a by varying the source voltage to be applied to the output stage 36a, however it may be possible to provide that the gain is changed by changing the bias voltage of the output stage 36a.

(c) The feedback control circuit for controlling the feedback operation for the power amplifier 30a may be constituted by circuits other than the shown circuit. For example, the high frequency power fetching means 40 may fetch a portion of the output power from the power amplifier 30a.

(d) The isolator 46 of FIG. 3 may be omitted in the case where the transmitter is not used in common with the receiver.

(e) In the above embodiment, the power controlling circuit used for the wireless transmitter of an automobile telephone in a cellular mobile communication is explained, however it is possible to apply the power controlling circuit of the present invention to apparatus other than a wireless transmitter.

As mentioned above in detail, since the power amplifying apparatus 12 or 14 is constructed in such a way that the gain of the output stage in the power amplifier is changed by the gain varying portion, the characteristic between the control electric power in the area where the controlled output power is small, can be improved such that the linearity of the characteristic is obtained in a wider range. Therefore, since the characteristic between the control voltage and the output electric power is improved, the controllable range of the electric power can be expanded. Furthermore, since the output power of the electric power amplifier is controlled by changing the gain of the output stage, the consumable power in the power amplifier can be reduced thereby improving the electric power efficiency.

In the case where the gain varying portion is constructed to change the source voltage by utilizing, for example, the switching operation, the consumable electric power may be reduced and the electric power efficiency of the output stage may be increased.

Next, another embodiment of the present invention will be explained with reference to FIG. 6.

Figure 6:
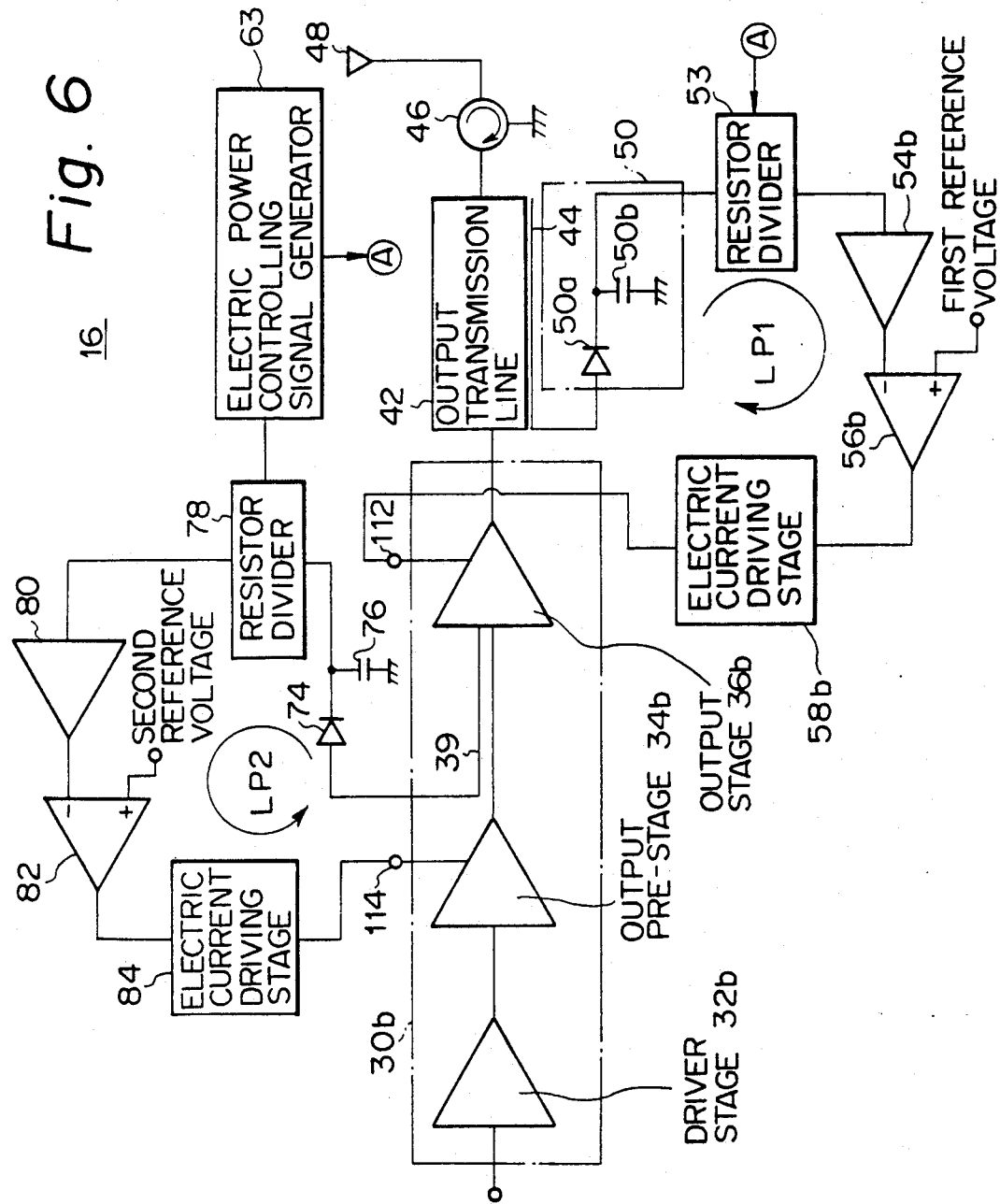

FIG. 6 shows a block diagram of another embodiment of a power amplifying apparatus 16. In this embodiment, the basic constitution that a transmission signal is amplified to apply it to an antenna, and the output electric power is controlled by obtaining the difference between the monitor voltage which is fetched from a portion of the output electric power and a reference voltage, is similar to the above-mentioned embodiments.

Namely, the transmission signal is amplified by the power amplifier 30b, and then applied to the antenna 48 through the output transmission line 42 and the isolator in order.

A portion of the output electric power is fetched by a coupling portion 44 such as a coupling transmission line and a coupling capacitor, the fetched power is detected by a detecting diode 50a, smoothed by the smoothing capacitor 50b and converted to the monitor voltage. The monitor voltage is converted in voltage (attenuation) by the resistor divider 53 driven on the basis of the command from the power controlling generator 63, and then amplified by the D. C. amplifier 54b and applied to the reverse input terminal of the comparator 56b of the operational amplifier. A first reference voltage is applied to the non-reverse input terminal of the comparator 56b and differenced with the first reference voltage. The difference voltage is amplified by the current driving amplifier stage 58b thereby increasing the current driving ability, and then it is applied to the power control terminal 112 as a control voltage to the power amplifier 30b.

In this embodiment, a three-stage construction composed of a driver stage 32b, an output pre-stage (sub-control stage) 34b, and an output stage (main control stage) 36b is used as the electric power amplifier 30b, and the above-mentioned control voltage is applied to the output stage 36b through the power control terminal 112.

According to the above-mentioned power controlling feedback circuit (referred to as a main power controlling feedback circuit hereinafter) LP1, the feedback control is performed in such a way that the monitor voltage from the D. C. amplifier 54b becomes equal to the first reference voltage thereby maintaining the output electric power from the power amplifier 30b at a stable predetermined electric power.

Assuming that, for example in an automobile telephone system, the dividing ratio (attenuation ratio) of the resistor divider 53 is changed to a large value when the distance from the base station (not shown) is increased, and also in this case the feedback control is performed in such a way that the monitor voltage from the D. C. amplifier 54b becomes equal to the first reference voltage thereby maintaining the output electric power from the power amplifier 30b at a stable predetermined electric power. In this case, the monitor voltage from the D. C. amplifier 54b is the same as the previous dividing ratio, however since the dividing ratio has been changed, the output electric power becomes large i.e. the monitor voltage inputted to the resistor divider 53 during the feedback processing, in comparison with the previous dividing ratio before unchanged condition, thereby maintaining the output electric power at a stable predetermined electric power.

Thus, a stabilization of the electric power control in the multistage amplification is achieved.

In addition to the above-mentioned basic constitution, a sub-power controlling feedback circuit LP2 for stabilizing the output electric power to be applied to the output stage 36b from the output pre-stage 34b is provided in this embodiment. Namely, it is a feature for this embodiment to provide the sub-power controlling feedback circuit LP2.

The sub-power controlling feedback circuit LP2 has a construction similar to that of the main power controlling feedback circuit LP1. Namely, it is composed of a coupling line 39, a detection diode 74, a smoothing capacitor 76, a resistor divider 78, a D. C. amplifier 80, a comparator 82, a current driving amplifier 84 and a power controlling terminal 114.

A portion of the electric power to the output stage 36b from the output pre-stage 34b is fetched by the coupling line 39, and the electric power is detected by the detection diode 74 and smoothed by the smoothing capacitor 76 to thereby convert to a monitor voltage. This monitor voltage is attenuated by the resistor divider 78 on the basis of the dividing ratio (electric power command) from the power controlling signal generator 63, and amplified by the D. C. amplifier 80, and then applied to the reverse input terminal of the comparator 82 constitution by an operational amplifier.

At the non-reverse input terminal of the comparator 82, a second reference voltage is applied and the difference between the monitor voltage and the second reference voltage is obtained. This difference voltage is amplified by the current driving amplifier stage 84 thereby increasing the current driving ability, and then applied to the power controlling terminal 114 as the control voltage to the output pre-stage 34b.

The resistor divider 78 in the sub-power controlling feedback circuit LP2 is switched in synchronism with the resistor divider 53 in, for example, the main power controlling feedback circuit LP1.

By this sub-power controlling feedback circuit LP2, the output electric power level of the output pre-stage 32b of the power amplifier 30b, i.e. the input electric power level to the output stage 36b is controlled, in accordance with the output electric power level of the wireless transmitter.

Even the control voltage to the output stage 36b becomes a small value such as 1 volt by being commanded with a small value as the output electric power level of the wireless transmitter, since the input power level to the output stage 36b is made small by the sub-power controlling feedback circuit LP2, the base-collector junction is normally made in reverse condition, even if a C-class amplifier is used as the output stage 36b. As a result, the oscillation of the main power controlling feedback circuit LP1 can be prevented completely.

As mentioned above, according to the embodiment mentioned above, the control voltage from the main power controlling feedback circuit LP1 may be applied to the output stage 36b in view of the electric power efficiency, which results in stable control of the electric power. The current of the output pre-stage 34b is also restricted by the sub-power controlling feedback circuit LP2, and therefore the electric power efficiency is not reduced by the provision of the sub-power controlling feedback circuit LP2 but is increased for the electric power efficiency.

Therefore, this embodiment is suitable to be applied to an automobile telephone system of the digital type in which a C-class amplifier is used for the output stage 36b as a linear amplifier.

In this embodiment, a C-class amplifier is applied to the output stage 36b, but other amplifiers may be applied to this embodiment.

As mentioned above, according to this embodiment, since the sub-power controlling feedback circuit is provided for stabilizing the electric power to the output stage, the bias voltage of the amplifying element in the output stage can be maintained at a predetermined condition, even in the case where the output electric power level is small, and further a stable control of electric power can be obtained without any oscillation in the power controlling feedback circuit to provide a power amplifying apparatus with high electric power efficiency.

Next, another embodiment of the power amplifying apparatus of the present invention is described with reference to the drawings.

Figure 7:
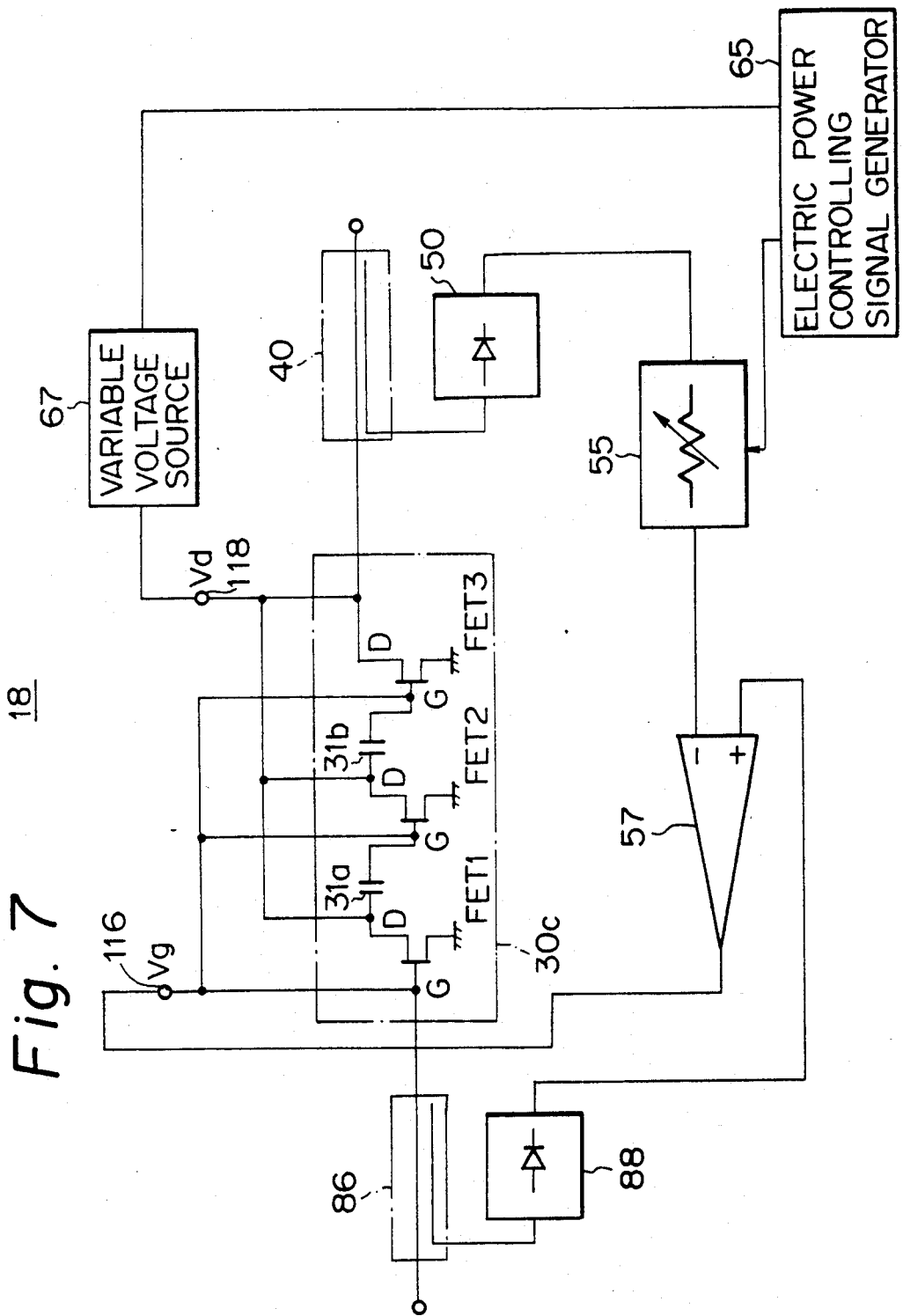

FIG. 7 is a circuit diagram showing another embodiment of a linear type power amplifying apparatus 18. In this embodiment, the power amplifier 30c is composed of three stages of field-effect transistor 1, 2 and 3 (referred to as simply FET hereinafter), and the drain (D) of FET 1 is connected to the gate (G) of FET 2 through a capacitor 31a for D. C. cut, and the drain of FET 2 is connected to the gate of FET 3 through a D. C. decoupling capacitor 31b. There is provided, in an actual amplifying circuit, a matching circuit, etc., however they are omitted for avoiding any complexity. The respective gates of FETs 1, 2 and 3 are connected to a feedback terminal 116, similarly the respective drain is connected to a control terminal 118 (voltage $V_d$). The output of the power amplifier 30c is connected to an output detector 50 through an output coupler 40, and further to the reverse terminal of a differential amplifier 57 through a variable attenuator 55.

The input side of the amplifier 30c is connected to the non-reverse terminal of the differential amplifier 57 through an input coupler 86 and an input detector 88, and the output of the differential amplifier 57 is fed backed to the feedback terminal 116. An variable voltage source 67 is connected to a control terminal 118. A power controlling signal generator 65 is connected to the variable attenuator 55 and the variable voltage source 67, and the control signal for controlling the electric power is applied to them.

Next, the operation of this embodiment will be explained hereinafter. The basic operation of the power amplifying apparatus mentioned above is similar to this embodiment. Detailed explanation will be made concerning the variable attenuator 55, the variable voltage source 67 and the power controlling signal generator 65 hereinafter.

In an automobile telephone communication, in order to reduce an interference between the same channel or adjacent channels and consumable electric power, the transmission electric output power of a terminal wireless transmitter is switched at 6 to 11 steps with e.g. 4 dB in accordance with the distance between a base station (not shown) and the terminal wireless transmitter. There is a method of changing the gain of the output electric power by providing the variable attenuator 55 to change a loop gain. The electric power control is performed by step-wise changing the amount of attenuation of the variable attenuator 55 in accordance with the control signal from the power controlling signal generator 65 composed of a control circuit including a microprocessor etc. The voltage $V_d$ of the variable voltage source 67 is also sometimes changed by the variable voltage source 67 in connection with the output electric power level. The voltage $V_d$ is changed so as to obtain an optimum linearity (input - output) inherently provided for the power amplifier 30c.

The number of stages for FET is practically 2 to 4 and preferably 3. Furthermore, the FET may be the MOS type or the junction type.

As mentioned above, according to this embodiment, since the gates of FETs are used as a feedback terminals, the driving electric power is approximately zero. Therefore, it is not necessary to provide a switching operation for increasing the electric power efficiency, and the filter for eliminating pulse. Furthermore, the amount of AM-PM conversion in comparison with the case of making the feedback operation to the collector of a transistor and to the drain of an FET. Furthermore, since plural stages of the amplifier are used, the electric power can be controlled with wide range of 50 dB or more. Furthermore, since the voltage $V_d$ is also changed in accordance with the control electric power level, it is possible to optimize the linearity in the respective levels, and further since the voltage $V_d$ is obtained when the electric power level is small, it is possible to restrict the consumable electric power.

Figure 8:
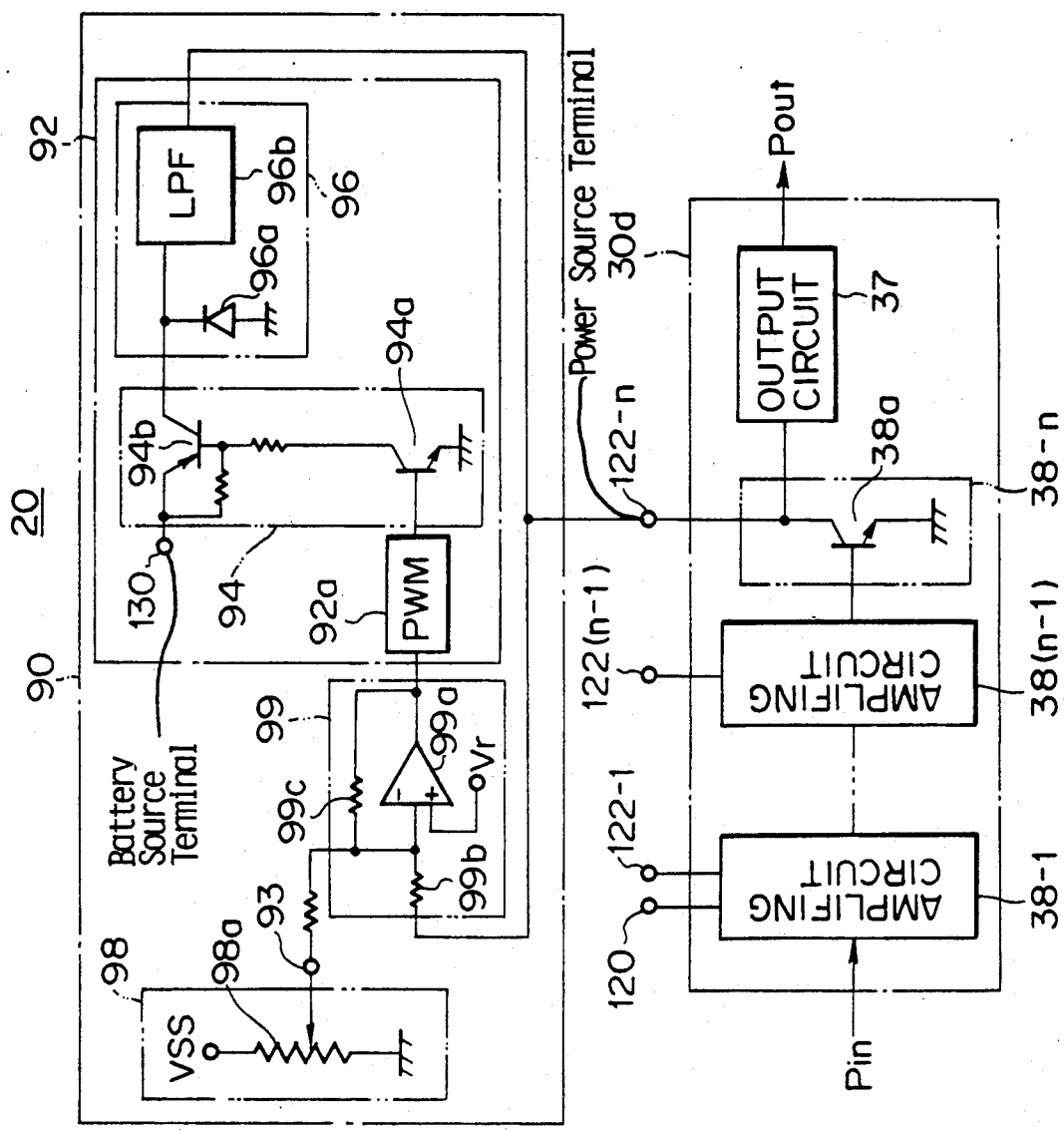

FIG. 8 shows another embodiment of the present invention, in which the present invention is applied to a linear power amplifying apparatus.

A feature of the power amplifying apparatus 20 is to provide a voltage stabilizing circuit 90 between the power source terminal 122-n of e.g. the final stage of the linear power amplifier 30d and the terminal 130 for connecting a battery source, and the stable voltage outputted from the power stabilizing circuit 90 can be voluntary changed.

Namely, the linear power amplifier 30d has a plurality of stages of amplifying circuits 38-l to 38-n for sequentially amplifying the input electric power Pin, and power source terminals 122-l to 122-n are provided for the amplifying circuits 38-l to 38-n respectively. Furthermore, a control terminal 120 is provided for controlling the output electric power at a voluntary stage of amplifying circuit such as the first stage of amplifying circuit 38-l. The output circuit 37 is connected for outputting the output electric power Pout with an impedance matching to the final stage of amplifying circuit 38-n.

The output electric power Pout is changed in its level in accordance with the control voltage to be applied to the control terminal 120 of the first stage amplifying circuit 38-l. A predetermined source voltage is applied to the power source terminals 122-l to 122-n of the amplifying circuits 38-l to 38-n respectively. The power source terminal 122-n of the final amplifying circuit 38-n should be connected to the battery source terminal 130 directly in order to flow a large current. The power source terminal 122-n is connected to the electric power source (battery) through a voltage stabilizing circuit 90.

The voltage stabilizing circuit 90 is a circuit for controlling the output voltage of a battery connected to the battery source terminal 130 in a feedback system and for supplying the stabilized voltage to the power source terminal 122-n, and the voltage stabilizing circuit 90 is composed of an error detecting portion 99, a voltage supplying portion 92 and a voltage varying portion 98.

The error detecting portion 99 is the circuit for a reference voltage Vr with the voltage on the source terminal 122-n thereby outputting the comparison result as an error voltage. The error detecting portion 99 has an error amplifier 99a which is a reverse amplifier, and the reference voltage Vr is applied to the positive (+) input terminal of the error amplifier 99a, and further the negative (−) input terminal (non-reverse input terminal) is connected to the power source terminal 122-n through an input resistor 99b. In turn, a feedback resistor 99c is provided between the output terminal of the error amplifier 99a and the negative (−) input terminal, and the gain of the error amplifier 99a is decided by the feedback resistor 99c and the input resistor 99b.

The voltage supplying portion 92 is a circuit for controlling the output voltage of the battery so that the error voltage outputted from the error amplifier 99a goes to zero, and supplying the stabilized voltage to the source terminal 122-n. The voltage supplying portion 92 is composed of a pulse width modulator (referred to as PWM) 92a, a current driving circuit 94 and a D. C. voltage converting circuit 96.

The PWM 92a is a circuit for outputting the pulse signal with the pulse width according to the error voltage outputted from the error amplifier 99a to the current driving circuit 94. The current driving circuit 94 has the function for effecting an ON-OFF control of the output of the battery connected to the power source terminal 130 by the switching operation due to the output from the PWM 92a, and further has an NPN transistor 94a as a small current switching portion and a PNP transistor 94b as a large current switching portion. The base of the transistor 94a is connected to the output side of the PWM 92a, and its emitter and collector are connected to the ground and the base of the transistor 94b respectively. The emitter of the transistor 94b is directly connected to the electric power (battery) of the transmitter through the battery source terminal 130, and further its collector is connected to the D. C. voltage converting circuit 96.

The D. C. voltage converting circuit 96 is a circuit for converting the output of the current driving circuit 94 and outputting the stabilized voltage to the source terminal 122-n, and includes a diode 96a, and a low pass filter (referred to as LPF hereinafter) 96b. The cathode of the diode 96a is connected to the collector of the transistor 96b, and further the anode of the diode 96a is connected to ground. The cathode of the diode 96a is connected to the input side of the LPF 96b and its output side is connected to the source terminal 122-n.

The voltage varying portion 98 is the circuit for changing the stabilized voltage supplied to the power source terminal 122-n by controlling, for example, the error detecting portion 99. The voltage varying portion 98 is composed of a variable resistor 98a disposed between the source voltage Vss and the ground, and its output side is connected to the negative (−) input terminal of the error amplifier 99a through the voltage controlling terminal 132 and the resistor 93.

Figure 9:
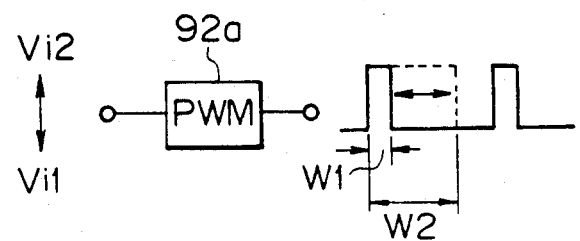

FIG. 9 is a view for explaining the operation of the PWM 92a in FIG. 8.

Figure 10:
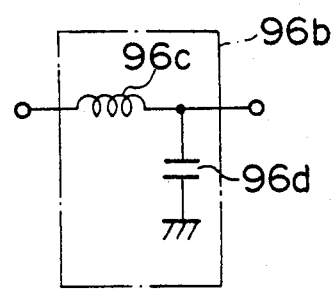

The PWM 92a outputs the pulse signal with a narrow pulse width W1 when the inputted error voltage is the low voltage Vi1, and with a wide pulse width W2 upon the high voltage Vi2. FIG. 10 is a view for showing a circuit construction of the LPF 96b in FIG. 8.

The LPF 96b is composed of an inductance 96c and a capacitor 96d. The inductance 96c and the bypass capacitor 96d effects the function that the penetration of high frequency A. C. component into the transistor 38a from the battery source terminal 130 or from the transistor 38a to the battery source terminal 130 is prevented by converting the pulse into a D. C. voltage and attenuating the high frequency component, and that the battery source terminal 130 is isolated for high frequency from the transistor 38a.

The operation of the linear power amplifying apparatus 20 thus constructed mentioned above will be explained hereinafter.

Figure 11:
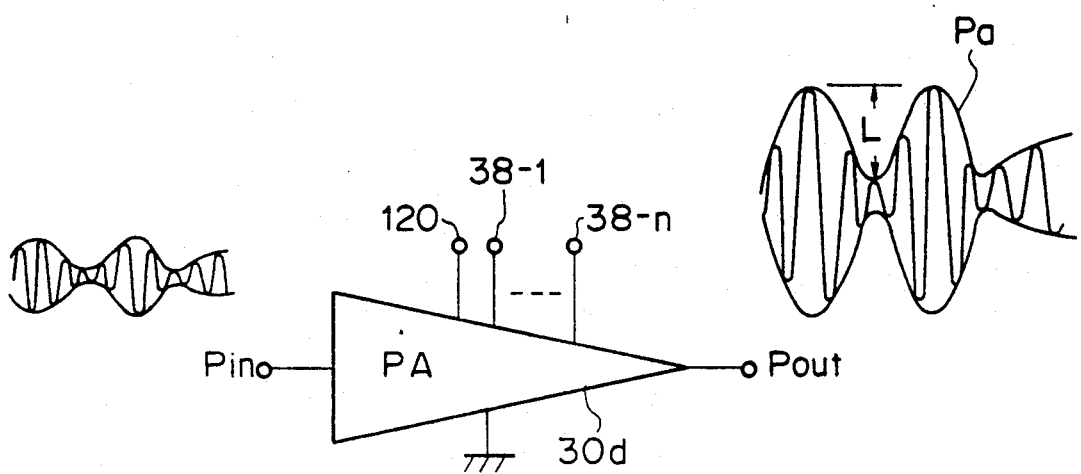
Figure 12:
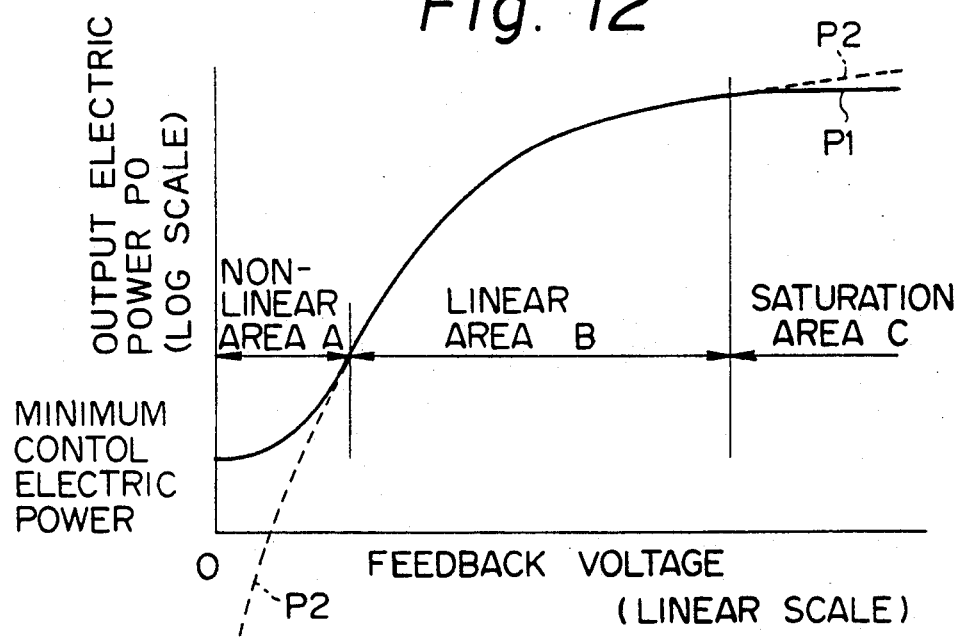

If the source voltage is supplied to each source terminal 122-l to 122-n of the linear power amplifier 30d, the linear power amplifier 30d operates. The amplitude component out of the phase component and the amplitude component of the input electric power Pin is amplified sequentially by each stage of the amplifying circuits 38-l to 38-n, and then the output of the final stage amplifying circuit 38-n is processed on the impedance matching by the output circuit 37, and then the output electric power as shown in FIG. 11 is outputted. In the case where the $\pi/4$ DQPSK signal used, e.g. in a digital cellular automobile telephone, is amplified, since the level of the output electric power Pout is usually changed, the amount L of the maximum level change of the envelope line Pa becomes 20 dB.

The voltage supplied to the power source terminal 122-n of the final stage of amplifying circuit 38-n is stabilized by the voltage stabilizing circuit 90 as follows.

If the voltage e.g. on the power source terminal 122-n is varied to a higher value, the error amplifier 99a in the error detecting portion 99 connected to the power source terminal 122-n has been the reverse amplifier, and therefore the voltage on the source terminal 122-n is compared with the reference voltage Vr, and the error voltage varying to the lower direction by reversing the comparison result is outputted to the PWM 92a. The PWM 92a is a circuit for changing the pulse width in such a manner that the pulse width is increased when the error voltage is large and the pulse width is decreased when the error voltage is small, and outputting the pulse signal. In this case, since the error voltage outputted from the error amplifier 99a is varied in the lower direction, the pulse width (ON duration)of the pulse signal outputted from the PWM 92a becomes narrow. By this narrow pulse width, the transistors 94a and 94b for increasing the current driving ability becomes ON-state, and the output of the battery connected to the battery source terminal 130 is supplied to the D. C. voltage converting circuit 96 through the transistor 94b.

By the diode 96a and the LPF 96b in the D. C. voltage converting circuit 96, the pulse component is eliminated and the D. C. voltage according to the pulse width is outputted to the power source terminal 122-n. In this condition, since the pulse width becomes narrow, the D. C. voltage at the output of the LPF 96b changes to a lower direction. Therefore, the voltage at the power source terminal 122-n is changed in the lower direction and in the direction in which the initial variation is cancelled.

By the negative feedback loop mentioned above, the power source voltage to be applied to the power source terminal 122-n is stabilized. Therefore, the following advantages are provided.

(a) According to the present embodiment, since the voltage stabilizing circuit 90 is provided and the stabilized voltage is applied to the power source terminal 122-n of the linear electric power amplifier 30d, and therefore it is possible to restrict the variation of the source voltage on the source terminal 122-n generated due to the variation of the output power Pout of the linear power amplifier 30d. Therefore, the expansion of the spectrum due to the variation of the source voltage is surely prevented, and it is possible to present a linear power amplifying apparatus with a good characteristic for the adjacent channel.

Furthermore, in this embodiment, the bias capacitor for giving the influence to the rising time upon the burst control is corresponding to the capacitor 96d in the LPF 96b. The capacitance value of the capacitance 96d may be the value that it is possible to form the LPF 96b so that the switching frequency $f_{cl}$ of the transistors 94a and 94b due to PWM 92a can be eliminated. Therefore, if the switching frequency $f_{cl}$ and the inductance 96c of the LPF 96b are selected suitably, the capacitance 96d may be comparatively small. Even if such small capacitance is used, the variation of the power source terminal 122-n due to the variation of the output electric power Pout may be restricted by the operation of the voltage stabilizing circuit 90.

Figure 13A:
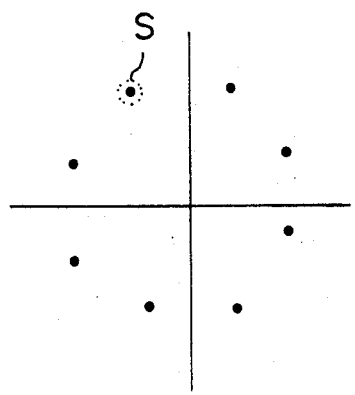
Figure 13B:
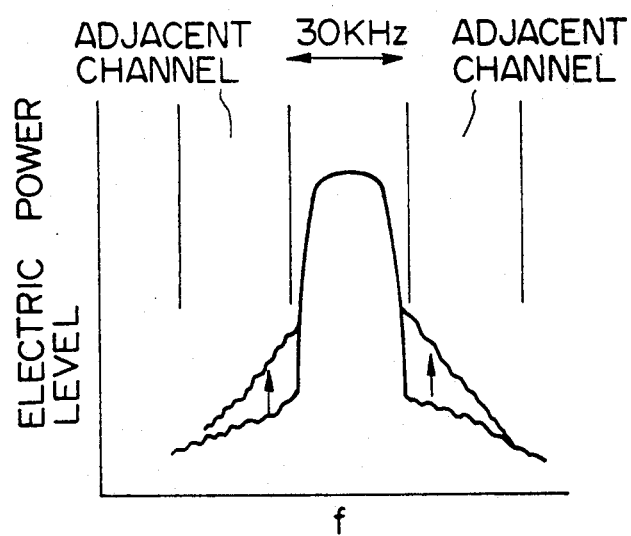
Figure 14:
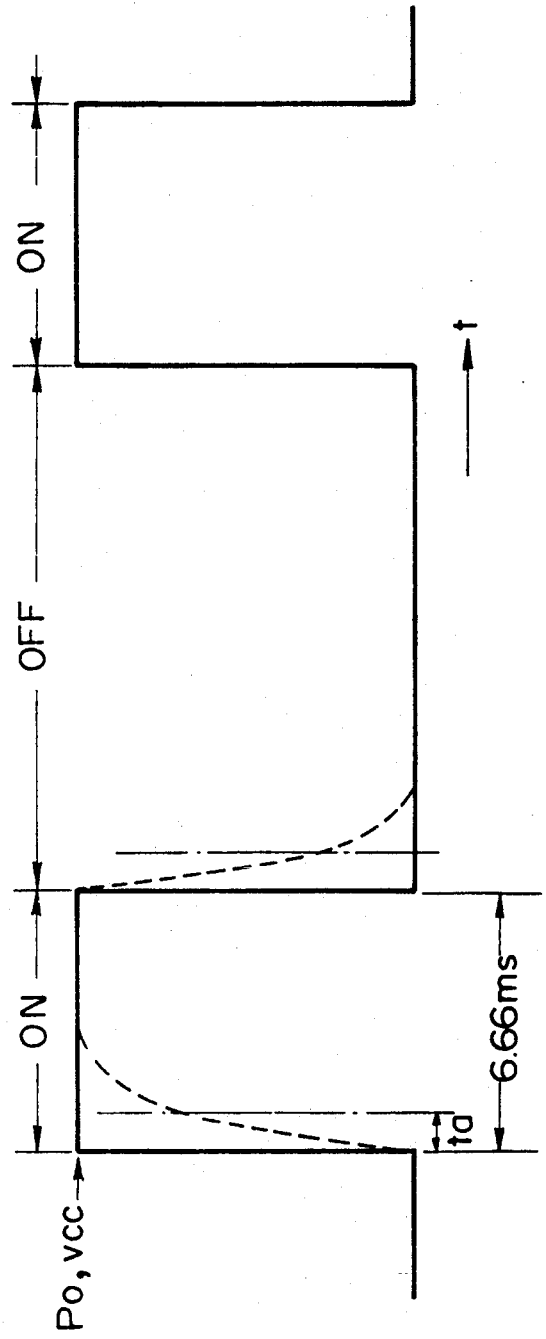

If there are set as the inductance 96c=0.1 mH, the switching frequency $f_{cl}$=500 KHz, the capacitance 61=5 $\mu$F, the cut frequency f of the LPF 96b becomes about 10 KHz and a sufficient amount of attenuation for 500 KHz is obtained. Therefore, the expansion of the spectrum can be surely prevented without increasing the response time upon the burst control (see FIG. 13b).

(b) By changing the variable resistor 98a in the voltage varying portion 98, the D. C. voltage on the negative (−) input terminal of the error amplifier 99a is changed, thereby voluntary setting the set voltage on the source terminal 122-n with the range zero to the battery voltage.

In, for example, the automobile telephone system, it is possible to control the transmission output of the transmitter at the terminal multi-stepwise (e.g. 6 to 9 steps), by using the control voltage applied to the control terminal of the linear power amplifier 30d, in accordance with the distance between the base station and the terminal mounted with the automobile telephone, in order to save the consumable electric power. In this embodiment, it is possible for control of the output electric power that the stabilized voltage may be voluntary changed by using the output varying portion 98, and therefore it is possible to the power source voltage applied to the power source terminal 122-n in accordance with the control level outputted from the linear power amplifier 30d. Therefore, the electric power efficiency of the linear power amplifier 30d can be increased and its linearity is improved.

(c) In this embodiment, since the stabilized voltage is supplied to the source terminal 122-n by the switching operation of the current driving circuit 96 by using the PWM 92a, the consumable loss in the voltage stabilizing circuit 90 is very minimized with the electric power efficiency e.g. 90%.

The present invention should not be limited to the embodiment mentioned above but several modifications may be made as follows.

(i) The voltage varying portion 98 is composed of the variable resistor 98a, but it may be possible to use other circuit. Furthermore, the voltage on the negative (−) input terminal of the differential amplifier 99a is changed on the basis of the output from the voltage varying portion 98 to change the stabilized voltage, but it may be possible that the reference voltage applied to the positive (+) input terminal of the differential amplifier 99a is changed on the basis of the output from the voltage varying portion 98, or the reference level in the PWM 92a may be controlled by the output from the voltage varying portion 98, thereby obtaining an equivalent advantages to that of the above-mentioned embodiment.

(ii) It is also possible to construct the amplifying circuits 38-1 to 38-n of the linear power amplifier 30d by using FET etc. and further the current driving circuit 94 by using a switching transistor etc.

(iii) It is also possible to modify the inductance 96c in the LPF 96b by using a λ/4 strip-line etc.

(iv) It is also possible to construct the error difference detecting portion 99 by using the circuit except the error differential amplifier 99a.

(v) It is also possible to modify the voltage supplying portion 92 by omitting the PWM 92a and controlling the output voltage of the battery in a feedback control by using a transistor etc. on the basis of the error voltage outputted from the error detecting portion 92 thereby producing a stabilized voltage.

As mentioned above, according to the embodiment, since the stabilized voltage is supplied to the source terminal of the linear power amplifier 30d by using the voltage stabilizing circuit of the feedback control system, it is possible to restrict the variation of the source voltage generated due to the variation of the output electric power from the linear power amplifier. Therefore, it is possible to provide the linear electric power amplifier with high precision without any delay of the response time upon the burst time, and any expansion of the spectrum due to the power source variation, and further any cross talk with other channel. Furthermore, since the stabilized voltage is changed by the voltage varying portion, it is possible to increase the electric power efficiency of the linear power amplifier and improve the linearity.

Furthermore, since the voltage supplying portion is constructed that the stabilized voltage is supplied by using the switching operation due to PWM, it becomes to be possible to very reduce the electric power loss.

Furthermore, according to the embodiment the present invention is applied to the transmitter of an automobile telephone terminal, but the present invention should not limited to the embodiments and it may be applicable to a wireless transmitter of the several types such as a portable telephone, a vessel, an aircraft or the like. Furthermore, the present invention may be applicable to an electronic devices needing a stable electric power.

We claim:

1. A power amplifying apparatus, comprising:

power amplifying means having an input for receiving an input signal and a power source terminal for receiving a D. C. voltage, said power amplifying means for amplifying an amplitude component of the input signal on the basis of the D. C. voltage at said power source terminal; and voltage stabilizing means having a battery source terminal for connection to a battery for receiving a battery voltage and an output connected to said power source terminal, said voltage stabilizing means for deriving and stabilizing a D. C. voltage from the battery voltage and supplying the stabilized D. C. voltage to said power source terminal in a feedback operation which feeds back and compares the D. C. voltage at said power source terminal with a D. C. reference voltage, wherein said voltage stabilizing means includes:

error detecting means having a first input for receiving the D. C. reference voltage, a second input for receiving the D. C. voltage present at said power source terminal and an output for producing an error difference voltage in dependence of a comparison between the D. C. reference voltage and the D. C. voltage at said power source terminal;

voltage supplying means having an input connected to said battery source terminal for receiving the battery voltage, a further input connected to the output of said error detecting means, and an output constituting the output of said voltage stabilizing means, said voltage supplying means for controlling the battery voltage to produce the stabilized D. C. voltage in dependence of the error difference voltage in a manner that drives the error difference voltage to substantially zero; and voltage varying means connected to the second input of said error detecting means for adding a selectable D. C. voltage to the stabilized D. C. voltage at said power source terminal for selectively changing the error difference voltage which controls said voltage supplying means and thereby selectively changing the stabilized D. C. voltage.

2. The apparatus of claim 1, wherein said voltage supplying means comprises:
- a pulse width modulator having an input constituting the further input connected to the output of said error detecting means and an output for producing a pulse signal having a pulse width which is a function of the error difference voltage;
- switching means having a first input constituting the input of said voltage supplying means for receiving the battery voltage, a second input connected to the output of said pulse width modulator for receiving the pulse signal and an output for producing the battery voltage switched on and off in accordance with the pulse signal; and
- voltage converting means having an input connected to the output of said switching means and an output constituting the output of voltage supplying means, said voltage converting means converting the switched battery voltage into a D. C. voltage which constitutes the stabilized D. C. voltage supplied to said power source terminal.

* * * * *